(12) United States Patent  (10) Patent No.: US 7,651,921 B2
Rauscher  (45) Date of Patent: Jan. 26, 2010

(54) SEMICONDUCTOR DEVICE HAVING A FRONTSIDE CONTACT AND VERTICAL TRENCH ISOLATION AND METHOD OF FABRICATING SAME

(75) Inventor: Wolfgang Rauscher, Schwaikheim (DE)

(73) Assignee: NXP B.V., Eindhoven (NL)

( * ) Notice: Subject to any disclaimer, the term of this patent is extended or adjusted under 35 U.S.C. 154(b) by 375 days.

(21) Appl. No.: 11/577,313

(22) PCT Filed: Oct. 13, 2005

(86) PCT No.: PCT/IB2005/053369

§ 371 (c)(1), (2), (4) Date: Apr. 13, 2007

(87) PCT Pub. No.: WO2006/040738

PCT Pub. Date: Apr. 20, 2006

(65) Prior Publication Data

US 2007/0262411 A1    Nov. 15, 2007

(30) Foreign Application Priority Data

Oct. 14, 2004  (EP) .................................. 04105047

(51) Int. Cl.
*H00L 21/76* (2006.01)
(52) U.S. Cl. ....................... 438/403; 438/402; 438/439; 257/E21.54; 257/E29.018
(58) Field of Classification Search ................. 438/402, 438/403, 439; 257/E21.54, E29.018
See application file for complete search history.

(56) References Cited

U.S. PATENT DOCUMENTS

| 5,767,012 | A  | * | 6/1998 | Fulford et al. | 438/622 |
| 6,274,460 | B1 | * | 8/2001 | Delgado et al. | 438/476 |
| 6,524,928 | B1 | * | 2/2003 | Hirabayashi | 438/402 |
| 6,551,866 | B1 | * | 4/2003 | Maeda | 438/143 |
| 2001/0044189 | A1 | * | 11/2001 | Heo et al. | 438/268 |
| 2002/0076879 | A1 | * | 6/2002 | Lee et al. | 438/241 |
| 2002/0093100 | A1 | * | 7/2002 | Gonzalez et al. | 257/754 |
| 2004/0053465 | A1 | * | 3/2004 | Hong | 438/253 |
| 2005/0145952 | A1 | * | 7/2005 | Gonzalez et al. | 257/374 |
| 2005/0260802 | A1 | * | 11/2005 | Pizzarulli | 438/152 |
| 2009/0114964 | A1 | * | 5/2009 | Han | 257/292 |

FOREIGN PATENT DOCUMENTS

JP        06151576        5/1994

* cited by examiner

*Primary Examiner*—Michelle Estrada

(57) ABSTRACT

There is a method of forming a contact post and surrounding isolation trench in a semiconductor-on-insulator (SOI) substrate. The method comprises etching a contact hole and surrounding isolation trench from an active layer of the substrate to the insulating layer, masking the trench and further etching the contact hole to the base substrate layer, filling the trench and contact hole with undoped intrinsic polysilicon and then performing a doping process in respect of the polysilicon material filling the contact hole so as to form in situ a highly doped contact post, while the material filling the isolation trench remains non-conductive. The isolation trench and contact post are formed substantially simultaneously so as to avoid undue interference with the device fabrication process.

9 Claims, 5 Drawing Sheets

SEMICONDUCTOR DEVICE HAVING A FRONTSIDE CONTACT AND VERTICAL TRENCH ISOLATION AND METHOD OF FABRICATING SAME

This invention relates generally to a semiconductor device having a frontside contact and vertical trench isolation and, more particularly, to a method of forming a contact post and respective trench isolation in respect of an active semiconductor device region of a semiconductor-on-insulator (SOI) substrate.

It is often desirable, particularly in high-voltage applications, to completely electrically insulate an active semiconductor device both from the underlying semiconductor substrate ("vertical" isolation) and from neighbouring active devices ("horizontal" isolation).

Vertical isolation of active devices is generally achieved by the use of a semiconductor-on-insulator (SOI) substrate which, referring to FIG. 1 of the drawings comprises a base semiconductor (typically silicon) substrate 2 with a buried insulator (typically silicon oxide) layer 4 formed on its upper surface, and an active bonded semiconductor (typically silicon) layer 6 formed on the buried insulator layer 4. Active devices (transistors) are fabricated in the active semiconductor layer 6 on top of the insulating layer 4.

In many applications, it is required to ground or bias the base semiconductor substrate 2, and for this a contact to the substrate 2 is required. There are two general solutions proposed in this regard: frontside and backside contacts, both of which configurations are generally known in the art.

Backside contacts, whereby the contact is provided to the substrate 2 from the rear side of the wafer (opposite to the active layer 6) after the active device has been processed, require specific processing equipment and additional processing steps, increasing significantly device fabrication costs. Furthermore, the risk of damaging already completely processed devices is not negligible. These drawbacks can be minimised by frontside contacts.

Frontside contacts, on the other hand, whereby a contact is provided from the front or upper surface of the wafer to the base substrate 2 via the active layer 6 and the buried insulator layer 4, do not suffer from these drawbacks.

Referring to FIG. 2 of the drawings, there is illustrated schematically an SOI substrate having formed therein a frontside contact post 8 comprising a contact hole extending from the frontside of the structure, through the active layer 6 and the buried insulator layer 4 to the base substrate 2, the contact hole being filled with a highly conductive semiconductor material to form a contact post having low resistivity (i.e. high conductivity).

Horizontal isolation of an active device from neighbouring active devices is often achieved by etching a surrounding trench through the active semiconductor layer 6 and covering the sidewalls of this trench 10 with a dielectric layer 12, as shown schematically in FIG. 3 of the drawings, so as to isolate the active part 14 of the structure (in which the active device is to be formed) from neighbouring active parts. A layer of isolating or conductive semiconductor material may be formed to fill the remainder of the trench 10, and then etched back to planarise the trench surface.

There are some known methods for filling the remainder of the trench 10 so as to minimize "crosstalk", which occurs as a result of the applied voltage in an active device causing potential fluctuations through the horizontal dielectric isolation, thus disturbing the performance of neighbouring devices. One method, described in the Japanese Patent Application No. 06,151,576, addresses this problem by filling the remaining part of trench 10 with a highly conductive layer, e.g. doped polysilicon, and applying a fixed potential to this conductive layer via a front or rear side electrode.

We have now devised an improved arrangement, and it is an object of the present invention to provide a method of fabricating a contact post and surrounding isolation trench such that both device features are provided without significant increase in fabrication time or cost.

In accordance with the present invention, there is provided a method of forming a contact post and a respective isolation trench in respect of an active semiconductor device region of a semiconductor-on-insulator substrate, said substrate comprising a base semiconductor substrate layer, a layer of insulating material on said base semiconductor substrate layer, over which layer of insulating material is provided an active semiconductor layer within which an active semiconductor device can be formed, the method comprising forming a contact hole and surrounding trench, said contact hole extending from a surface of said active semiconductor layer to said base semiconductor substrate layer and said surrounding trench extending from a surface of said active semiconductor layer to said layer of insulating material, providing the sidewalls of said trench with a dielectric layer, filling said contact hole and said surrounding trench with a dielectric or substantially non-conductive semiconductor material, and filling said contact hole with a substantially highly conductive semiconductor material so as to form a conductive contact post.

Thus, no specific potential is required to be applied to the isolation trenches to achieve horizontal decoupling (in contrast to the above-mentioned prior art), and vertical decoupling can be simultaneously achieved by connecting the base substrate layer via a highly conductive post (and other components which are elements of a standard device manufacturing process) to a frontside electrode. Furthermore, contrary to the method described in the above-mentioned prior art, the problem of crosstalk is addressed by filling the trench with a dielectric, (e.g. silicon dioxide) or substantially non-conductive semiconductor material, e.g. intrinsic silicon, which has the added advantage of avoiding stress-related problems, e.g. crystal defects, during further high temperature device fabrication processing.

The present invention achieves the above-mentioned object of the invention because the highly conductive contact post and respective surrounding non-conductive isolation trench can be constructed substantially simultaneously, and the proposed method also has the following significant advantages:

- the method of contact formation corresponds with the ground rules of a submicron device fabrication process;
- the contact forming process is (preferably) completed before the building of active components within the device fabrication process starts, following which the wafer can be subject to standard device processing;
- no additional topography or planarity issues are created, due to the formation of the contact via the original active semiconductor (silicon);

In a first preferred embodiment, the step of forming the contact hole and surrounding trench comprises the sub-steps of substantially simultaneously etching a hole and surrounding trench which extend from a surface of the active semiconductor layer to the layer of insulating material, masking the trench and then further etching the hole to the substrate layer so as to form the contact hole. Thus, the surrounding trench, and the main part of the contact hole can be formed in a single step.

A dielectric layer is preferably deposited substantially simultaneously on the sidewalls of the trench and the hole, prior to a masking step, wherein subsequent etching of the hole to the substrate layer results in removal of the dielectric layer from the sidewalls thereof (thereby eliminating the need to mask the contact hole during formation of the dielectric layer).

In a first exemplary embodiment, the step of forming the contact hole and surrounding trench comprises the sub-steps of substantially simultaneously etching a hole and surrounding trench which extend from a surface of the active semiconductor layer to the layer of insulating material, masking the trench and then further etching the hole to the substrate layer so as to form the contact hole. Thus, the surrounding trench, and the main part of the contact hole can be formed in a single step.

A dielectric layer is preferably deposited substantially simultaneously on the sidewalls of the trench and the hole, prior to a masking step, wherein subsequent etching of the hole to the substrate layer results in removal of the dielectric layer from the sidewalls thereof (thereby eliminating the need to mask the contact hole during formation of the dielectric layer).

Subsequently, a substantially non-conductive material is deposited, followed by the deposition of a highly conductive material. By choosing suitable width of the isolation trench and the contact hole respectively, it is achieved, that the isolation trench is completely filled with the substantially non-conductive material and only the contact hole is filled with the highly conductive material, as illustrated later (see FIG. 4d). After removal of the highly conductive material, the substantially non-conductive material and the dielectric material from the surface of said active silicon (6), both desired semiconductor device features are completed: an isolation trench for horizontal decoupling, containing dielectric and substantially non-conductive material only, and a contact post, through which a fixed potential can be applied to the base substrate 2 via a frontside electrode for vertical decoupling.

In a second exemplary embodiment, not only the sidewalls of the isolation trench are covered with the dielectric material, but the isolation trench is completely filled with the dielectric material. In this case, the dielectric material within the isolation trench is protected during the etching of the hole to the substrate layer without performing a masking step. Thus, this additional masking step can be avoided.

In a third exemplary embodiment, the deposition of the highly conductive layer is eliminated, and both the isolation trench and the contact hole are filled with the substantially non-conductive material only. In this case, the contact post is made conductive, for example by a diffusion process, using the dopants of the active semiconductor layer (6) or a highly doped semiconductor material filled into the contact hole as a doping source. In most cases, such a diffusion process will be part of subsequent standard semiconductor device processing.

Said dielectric layer of all embodiments may comprise silicon dioxide, said substantially non-conductive layer may comprise intrinsic silicon and said highly conductive layer may comprise doped silicon, for example. These examples are simply a reflection of current preferred fabrication processes, and other suitable materials are envisaged, such that the present invention is not intended to be limited in this regard.

Also in accordance with the present invention, there is provided an integrated circuit die comprising a semiconductor-on-insulator substrate, said substrate comprising a base semiconductor substrate layer, a layer of insulating material on said base semiconductor substrate layer, over which layer of insulating material is provided an active semiconductor layer within which an active semiconductor can be formed, said integrated circuit die comprising a contact post and a respective surrounding insulation trench according to the method defined above.

The present invention also extends to a method of fabricating an integrated circuit comprising an active semiconductor device, the method comprising forming a respective contact post and isolation trench according to the method defined above.

The present invention extends still further to an integrated circuit fabricated in accordance with the above-mentioned method.

These and other aspects of the present invention will be apparent from, and elucidated with reference to, the embodiment described herein.

An embodiment of the present invention will now be described by way of example only and with reference to the accompanying drawings, in which.

Referring to FIGS. 4, 4a-4f and 5 of the drawings, a device fabrication method according to an exemplary embodiment of the present invention will now be described in detail.

Step 100

Figure 1:
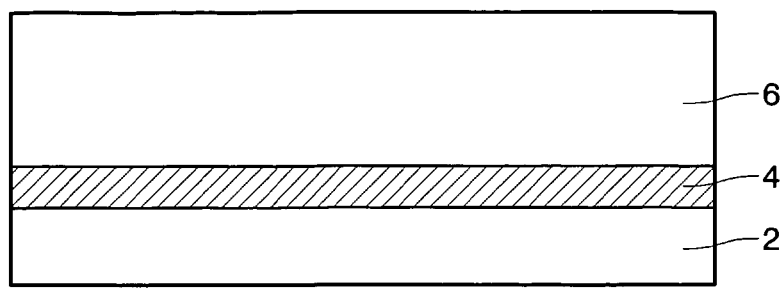
FIG. 1 is a schematic cross-sectional view of a semiconductor-on-insulator (SOI) substrate.
Figure 2:
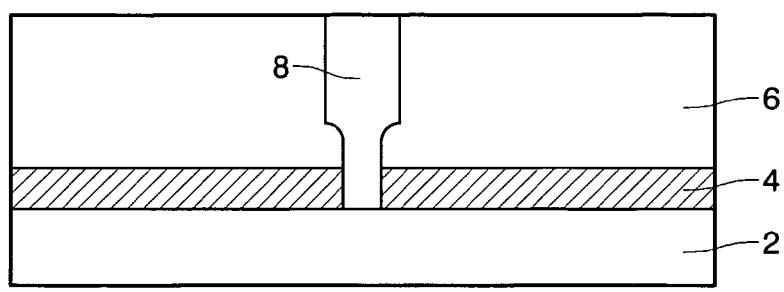
FIG. 2 is a schematic cross-sectional view of the SOI substrate of FIG. 1 including a contact post extending from a surface of the active layer of the substrate to the base substrate layer thereof.
Figure 3:
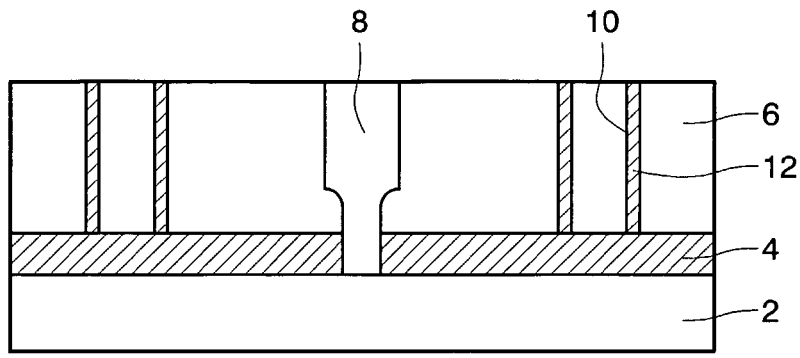
FIG. 3 is a schematic cross-sectional view of the SOI substrate of FIG. 1 including a contact post extending from a surface of the active layer of the substrate to the base substrate thereof and a surrounding isolation trench extending from the surface of the active layer to the insulating layer thereof.
Figure 4:
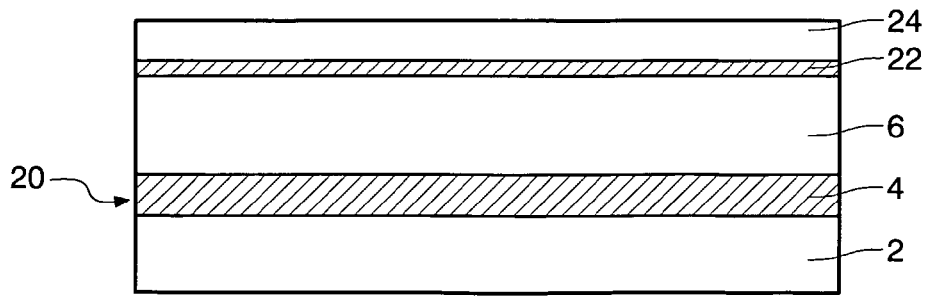
FIGS. 4 and 4a-4f-4e illustrate schematically the various processing stages of a method according to an exemplary embodiment of the present invention.

Consider the silicon-on-insulation substrate 20 illustrated in FIG. 4 of the drawings, wherein the base substrate layer 2 comprises silicon, the insulating layer 4 comprises silicon dioxide ($SiO_2$) and the active semiconductor layer 6 comprises silicon. In a first step, a field oxide layer, comprising a layer 22 of silicon dioxide ($SiO_2$) is grown on the exposed surface of the active layer 6 of the substrate 20 through an oxidation process, which will be well known to a person skilled in the art. The purpose of the field oxide layer is to protect the active layer 6 of the substrate 20 and for use in the creation of a doping barrier. A subsequent nitradation step may also be performed to create a nitride ($Si_3N_4$) layer 24 on the field oxide layer 22. The steps of creating the field oxide layer 22 and nitride layer 24 may comprise standard PAD oxide/nitride deposition steps using standard films for active area definition, as will be apparent to a person skilled in the art of semiconductor device fabrication.

Step 102

Figure 4A:
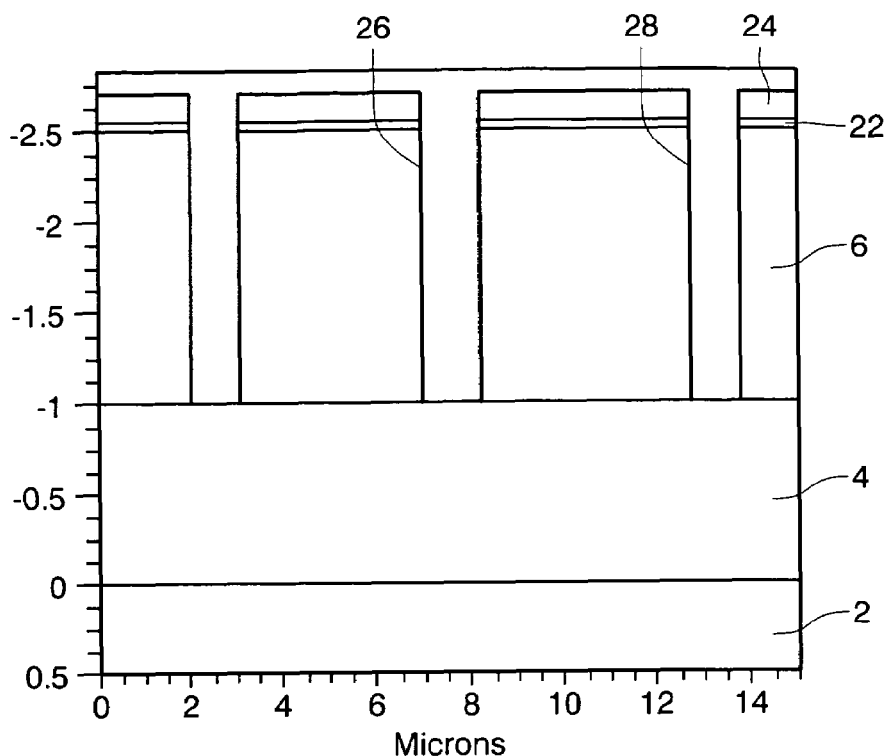
Figure 4B:
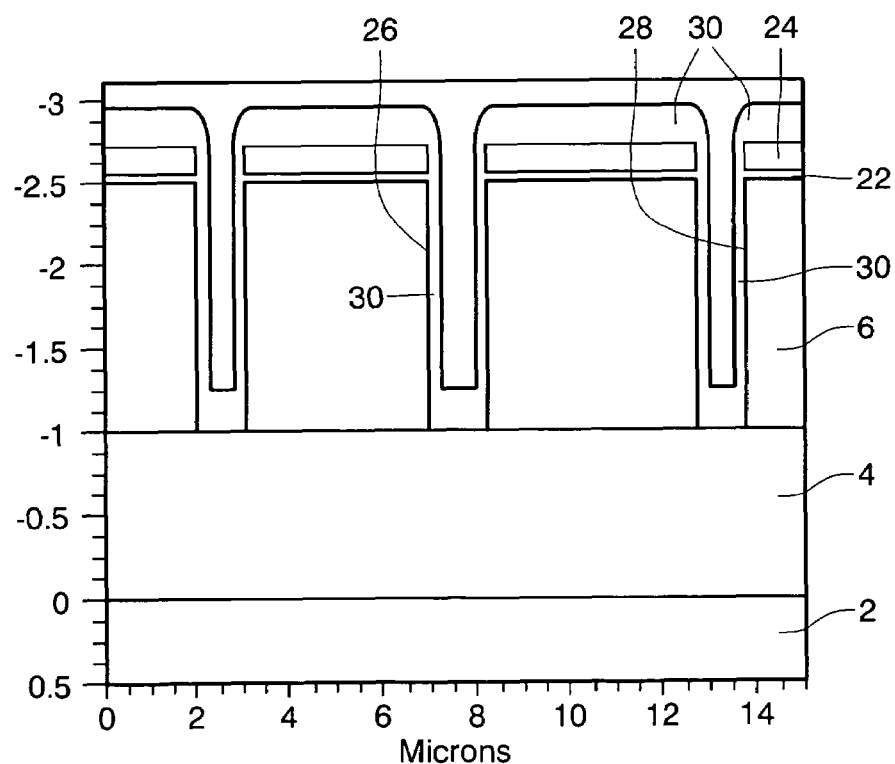

Next, a hole 26 and surrounding trench 28 is etched through the active silicon layer 6, as illustrated in FIG. 4a, and a dielectric layer 30 of silicon dioxide is deposited (step 14) over the top of the remaining nitride layer 24 and the sidewalls of the hole 26 and surrounding trench 28, as shown in FIG. 4b.

Step 106

Figure 4C:
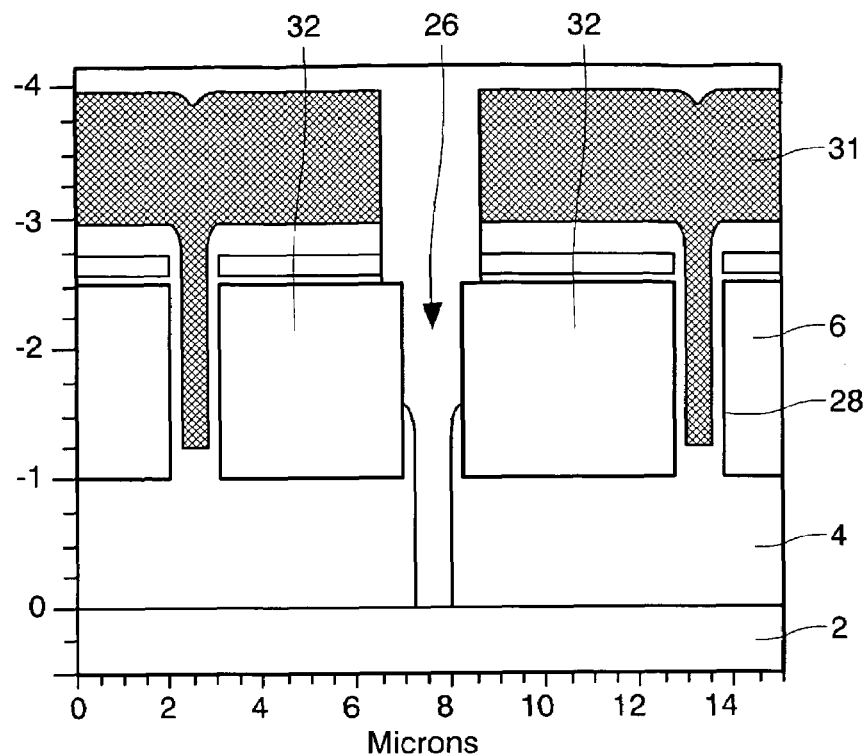

Next, a masking layer 31, such as a CHR (RTM) adhesive tape, is provided over the active device regions of the substrate and in the isolation trenches 28, and a subsequent etching process is performed to extend the contact hole 26 through the insulating layer 4 to the base substrate layer 2, as shown in FIG. 4c. It will be appreciated that this etching process is performed under selected conditions which will be well known to a person skilled in the art, such that the dielectric layer is removed from the sidewalls of the contact hole 26, as shown in FIG. 4c.

Step 108

Figure 4D:
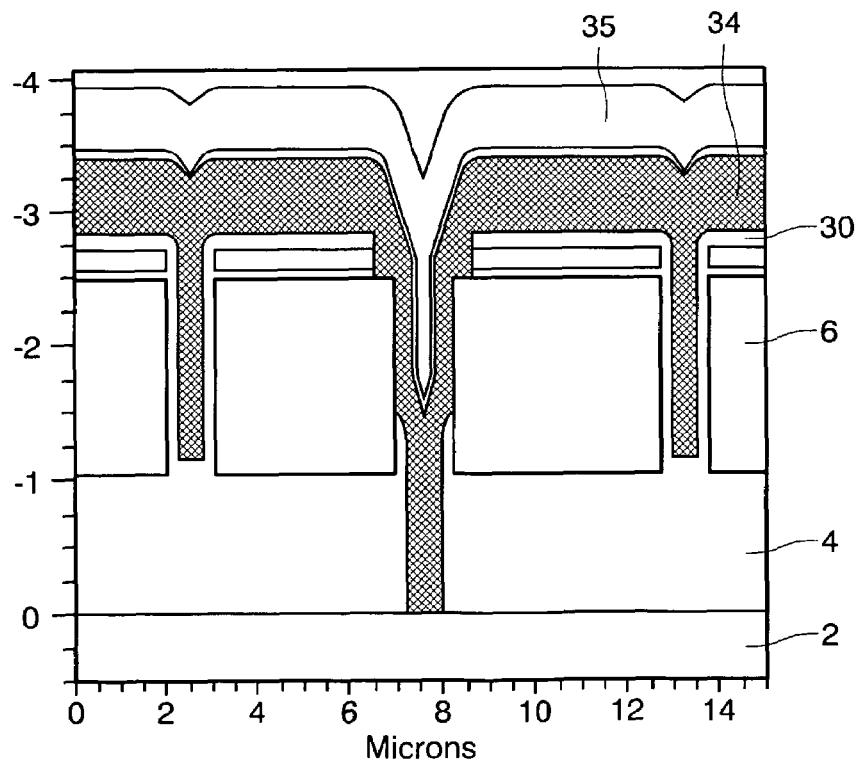

Following the etching step 106, the mask 30 is removed and undoped (intrinsic) polysilicon 34 is deposited on the wafer so as to fill the trench 28 and part of the contact hole 26, following which in situ doped polysilicon 35 is deposited on the wafer so as to complete the filling of the contact hole 26, as shown in FIG. 4d.

Step 110

Figure 4E:
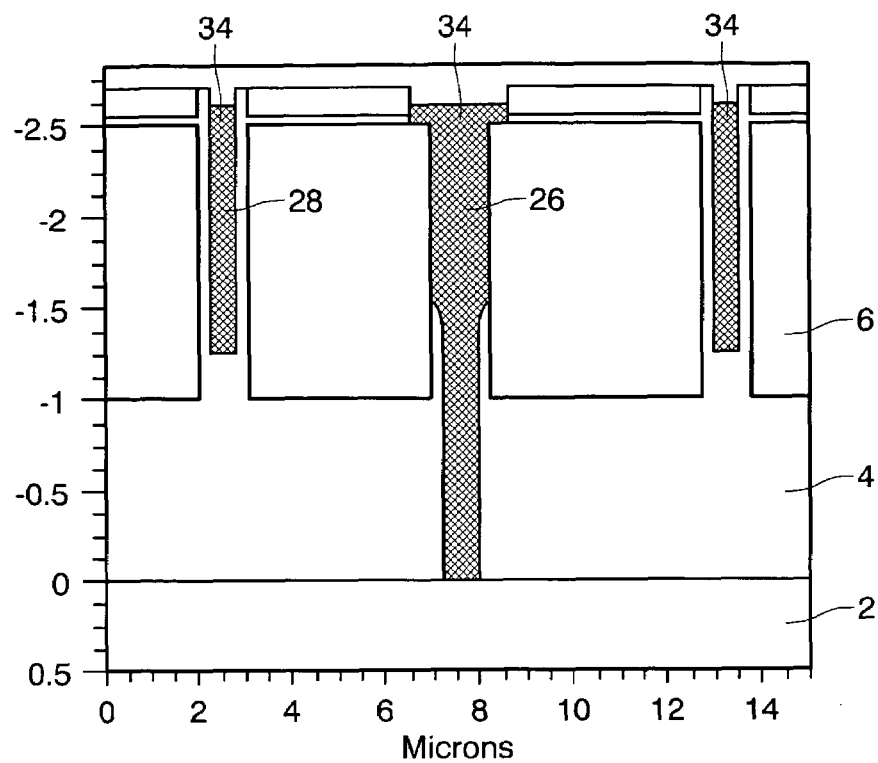

The layers of doped and undoped polysilicon as well as the dielectric layer are removed from the top of the nitride layer 24 to plarise the trench and contact hole surfaces, as shown in FIG. 4e. This may be achieved by a CMP (chemical mechanical polishing) which removes material from uneven topography of a wafer surface until a flat (planarised) surface is created. This allows subsequent photolithography to take place with greater accuracy, and enable film layers to be built up with minimal height variations.

Step 112

Figure 4F:
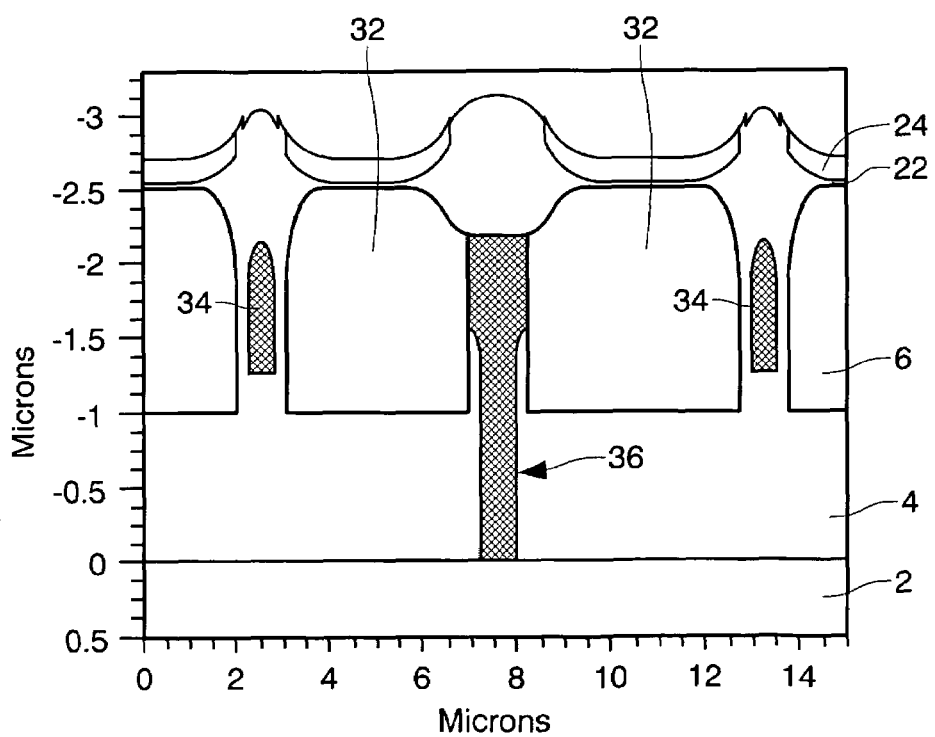
Figure 5:
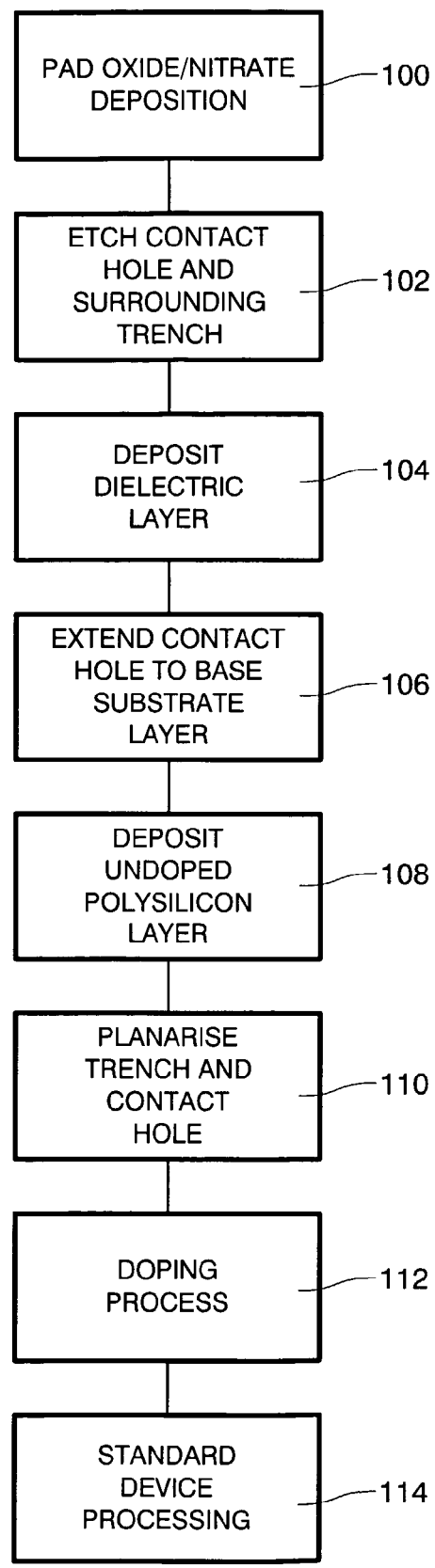
FIG. 5 is a schematic flow diagram illustrating the principal steps of a device fabrication method according to an exemplary embodiment of the present invention.

Following this process, standard device processing (step 114) is recommenced, which usually involves the definition of active areas by, for example, a LOCOS (local oxidation of silicon) process, as well as high temperature anneal processes, during which diffusion of dopants in silicon will occur, as shown in FIG. 4f.

Step 114

Construction of the frontside electrode may be completed using standard device processing, for example by contacting the surface of the active silicon 6 next to the contact post 8 via a metal plug, which can be connected to a wire outside of the silicon device.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming a contact post and a respective isolation trench in respect of an active semiconductor device region of a semiconductor-on-insulator substrate, said substrate comprising a base semiconductor substrate layer, a layer of insulating material on said base semiconductor substrate layer over which layer of insulating material is provided an active semiconductor layer within which an active semiconductor device can be formed, the method comprising
forming a contact hole and surrounding trench, said contact hole extending from a surface of said active semiconductor layer to said base semiconductor substrate layer and said surrounding trench extending from a surface of said active semiconductor layer to said layer of insulating material,
providing the sidewalls of said trench with a dielectric layer,
completely filling said surrounding trench with a dielectric or substantially non-conductive semiconductor material and
partially filling said contact hole with a dielectric or substantially non-conductive semiconductor material and filling said contact hole the rest of the way with a substantially conductive semiconductor so as to form a conductive contact post.

2. A method according to claim 1, wherein said contact hole and surrounding trench are first filled with a substantially non-conductive semiconductor material, following which a diffusion process is performed in respect of said semiconductor material filling said contact hole only so as to introduce dopants into said semiconductor material and form the conductive contact post.

3. A method according to claim 2, wherein the dopant source for said diffusion process includes the dopants in said active semiconductor layer or a doped semiconductor material filled into said contact hole.

4. A method according to claim 1, the step of forming the contact hole and surrounding trench includes the sub-steps of
etching a hole and surrounding trench which extend from the surface of the active semiconductor layer to the layer of insulating material,
filling said insulating trench with a dielectric material, and then further etching the hole to the substrate layer so as to form the contact hole.

5. A method according to claim 1, wherein the step of forming the contact hole and surrounding trench includes the sub-steps of substantially simultaneously etching a hole and surrounding trench which extend from a surface of the active semiconductor layer to the layer of insulating material,
masking or otherwise protecting the trench and
then further etching the hole to the substrate layer so as to form the contact hole.

6. A method according to claim 5, wherein a dielectric layer is preferably deposited substantially simultaneously on the sidewalls of the trench and the hole, prior to the masking step, wherein subsequent etching of the hole to the substrate layer results in removal of the dielectric layer from the sidewalls thereof.

7. An integrated circuit die comprising a semiconductor-on-insulator substrate said substrate comprising
a base semiconductor substrate layer
a layer of insulating material on said base semiconductor substrate layer, over which layer of insulating material is provided an active semiconductor layer within which an active semiconductor can be formed, said integrated circuit die includes a contact post and a respective surrounding insulation trench according to the method of claim 1.

8. A method of fabricating an integrated circuit comprising an active semiconductor device, the method comprising providing a semiconductor-on-insulation forming a respective contact post and isolation trench according to the method of claim 1.

9. An integrated circuit fabricated in accordance with the method of claim 6.

* * * * *